United States Patent [19]

Miller

[11] 4,361,634

[45] Nov. 30, 1982

[54] ARTWORK MASTER FOR PRODUCTION OF MULTILAYER CIRCUIT BOARD

[75] Inventor: Robert Miller, Poway, Calif.

[73] Assignee: NCR Corporation, Dayton, Ohio

[21] Appl. No.: 7,731

[22] Filed: Jan. 30, 1979

Related U.S. Application Data

[60] Continuation of Ser. No. 708,464, Jul. 26, 1976, abandoned, which is a division of Ser. No. 593,341, Jul. 3, 1975, abandoned.

[51] Int. Cl.³ .............................................. G03F 5/00
[52] U.S. Cl. ......................................... 430/5; 430/22; 430/311; 430/318; 430/319; 430/951; 428/901; 156/901
[58] Field of Search ............... 361/409; 156/901; 430/4, 5, 22, 311, 319, 951, 312, 318; 428/901

[56] References Cited

U.S. PATENT DOCUMENTS

| | | | |
|---|---|---|---|
| 3,169,063 | 2/1965 | Johnston et al. | 156/901 X |
| 3,385,702 | 5/1968 | Koehler | 430/323 X |
| 3,508,919 | 4/1970 | Reimer | 430/269 X |
| 3,663,223 | 5/1972 | Camenzind | 430/319 X |
| 3,669,666 | 6/1972 | Kleitman et al. | 430/5 X |
| 3,782,942 | 1/1974 | Compare | 430/396 |
| 3,784,380 | 1/1974 | Compare | 430/318 |
| 3,824,433 | 7/1974 | Newton | 361/409 X |

Primary Examiner—Roland E. Martin, Jr.

Attorney, Agent, or Firm—J. T. Cavender; Edward Dugas; Stephen F. Jewett

[57] ABSTRACT

A multilayer printed circuit board structure and a method for generating artwork masters for the manufacture thereof. The multilayer board comprises universal internal layers of predefined circuit patterns. The internal layers include power and ground planes, and for boards having high component and circuit density, one or two signal crossover layers with short, equal-length runs oriented transversely to the runs of an adjacent outermost signal layer. Electrical interconnections between layers of the circuit board are effected by interlayer conductors such as pins or plated-through holes at predefined locations. The artwork masters for the outermost layers are generated utilizing two degrees of layout precision. A universal layout master having interconnection pads and parallel circuit runs extending across the entire surface of the board is first prepared using a high degree of precision. The universal layout master is then superposed with other layout masters including a component matrix and utilized to generate a composite artwork master having relatively short circuit runs of a second degree of precision interconnecting the parallel runs and the pads. A tool for a unique outermost layer is then reproduced from the composite artwork master utilizing an artwork master of another layer to control interlayer registration.

2 Claims, 15 Drawing Figures

ARTWORK MASTER FOR PRODUCTION OF MULTILAYER CIRCUIT BOARD

This is a continuation of application Ser. No. 708,464, filed July 26, 1976, now abandoned, which is a division of Ser. No. 593,341, filed July 3, 1975, abandoned.

BACKGROUND OF THE INVENTION

1. Field for the Invention

The present invention relates generally to the manufacture of circuit board assemblies, and more particularly to a multilayer circuit board assembly and a method for generating tool masters therefor.

The development of printed circuits has provided many advantages over previous techniques, including reliability, reduction of cost, and reproducibility of circuits. The multilayer printed circuit board further extended the capabilities of the art by allowing greater density of interconnections, shorter circuit runs, and conservation of space.

2. Description of the Prior Art

The methods of designing multilayer printed-circuit boards in the prior art are characterized by extended design time, long lead time for fabrication and high cost, especially for short production runs. This is due to the multiplicity of steps involved in generating coordinated artwork for a plurality of circuit layers. Each step must maintain a high degree of accuracy and tolerances for each individual circuit layer in order to achieve the overall accuracy required for the assembled board. Multilayer board artwork is generally custom-designed for only one printed-circuit board type. Such custom designs are difficult to modify and virtually impossible to repair without special facilities.

One prior art method of multilayer board design which succeeded in alleviating some of the above-mentioned problems utilized preconfigured internal circuit layers having a plurality of multiterminal circuit paths crossing the board, and uniquely designed outer circuit layers interconnected via the internally disposed crossboard circuits. This prior art method confined circuit routing largely to the internally disposed layers and constrained circuit design by producing internally disposed circuit stubs of substantial length which were potentially degrading to the operation of certain circuits.

SUMMARY OF THE INVENTION

It is, therefore, a principal object of my invention to provide an improved multilayer circuit board.

Another object of my invention is to provide an improved multilayer circuit board having internal universal circuit layers predesigned in concert with a universal external circuit pattern, which external pattern is alterable to form unique circuits without degrading the design.

A more specific object of the present invention is to provide an improved multilayer circuit board having a unique circuit layer generated from a universal circuit pattern, and having predictable characteristic impedance, signal propagation delay, crossover capacitance and cross talk among circuits.

Still another object of my invention is to provide an improved multilayer circuit board in which the cost and lead time for fabrication is significantly reduced, as contrasted with prior art devices.

It is another object of my invention to provide an improved method for making artwork masters of multilayer printed circuit patterns.

Another object of the present invention is to provide an improved method for generating unique multilayer circuit-board artwork from universal artwork with predetermined circuit design characteristics.

These and other objects and features of my invention are achieved in accordance with one aspect thereof by a multilayer circuit board having internal circuit layers of universal design which are fabricated utilizing a first degree of layout precision. Circuit layers disposed on the major external surfaces of the board include circuit patterns having a first portion thereof generated utilizing the first degree of precision and including a universal matrix of interconnection pads, a first set of mutually parallel circuit runs extending across one of the external surfaces, and a second set of mutually parallel circuit runs extending across the other external surface in a direction transverse to the direction of the first set. A second portion of the external circuit pattern is generated utilizing a second degree of layout precision and includes relatively short-length runs interconnecting selected points of the first pattern.

BRIEF DESCRIPTION OF THE DRAWINGS

The invention is pointed out with particularity in the appended claims; however, other features of the invention will become more apparent and the invention will be best understood by referring to the following detailed description in conjunction with the accompanying drawing in which:

FIG. 5—Outer Layer, Signal Plane, Component Side.

FIG. 6—Inner Layer, Signal Plane, Component Side.

FIG. 7—Inner Layer, Voltage Plane.

FIG. 8—Inner Layer, Ground Plane.

FIG. 9—Inner Layer, Signal Plane, Solder Side.

FIG. 10—Outer Layer, Signal Plane, Solder Side.

DESCRIPTION OF THE PREFERRED EMBODIMENT

Figure 1:
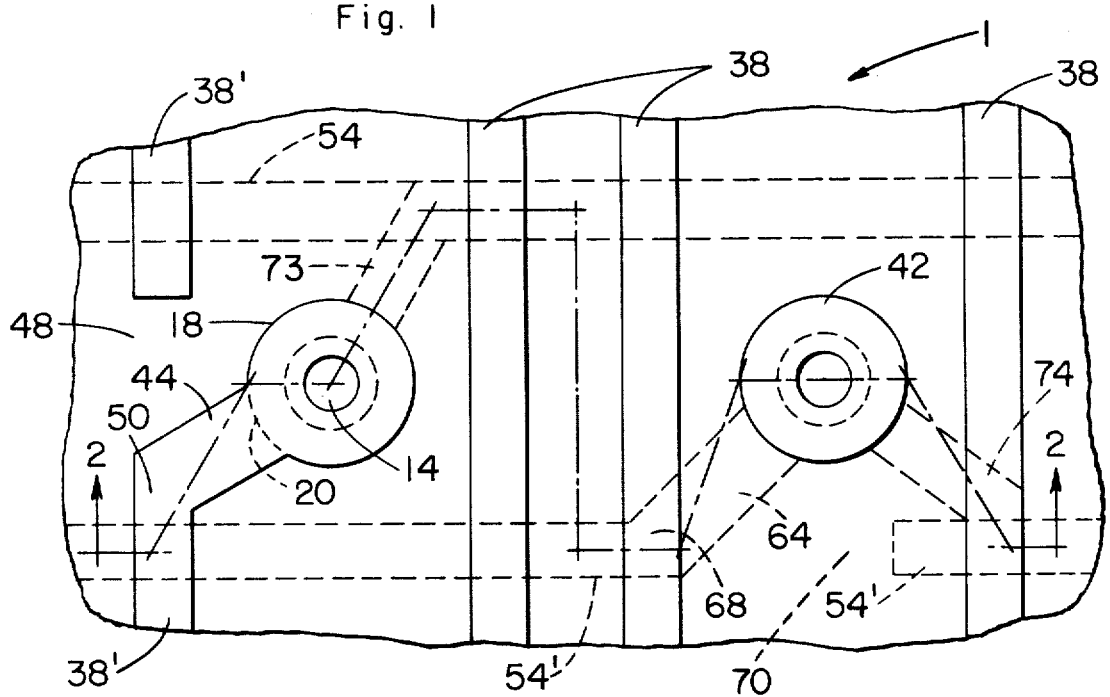
FIG. 1 is a plan view of a portion of a printed-circuit board in accordance with the present invention.
Figure 2:
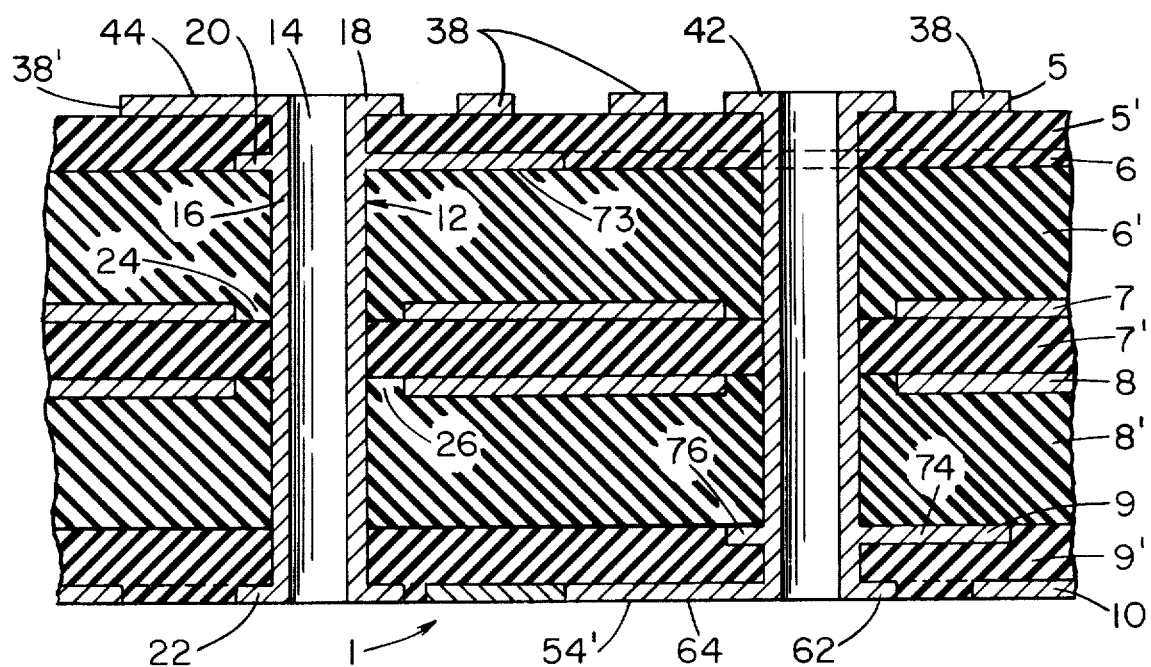
FIG. 2 is a sectional view taken generally along line 2—2 of FIG. 1.

Referring now to the figures by characters of reference, FIGS. 1 and 2 illustrate a portion of a multilayer printed-circuit board 1 made in accordance with the process of the present invention. The board 1 comprises a plurality of planar circuit patterns or layers 5-10 of conductive material such as copper. Each of the layers 5-10 is separated from the adjacent circuit layer by one of a plurality of planar substrates 5'-9' interposed therebetween. The substrates 5'-9' may be formed of epoxy-glass or other suitable insulating material well known in the art.

Multilayer printed-circuit boards generally comprise a number of circuit-bearing substrates such as the substrates 5'-9' of FIG. 2 superposed in orderly registration and laminated or otherwise bonded together to form an integral assembly or board having internal as well as external circuit layers. Electrical interconnections between the layers may be established by various means such as conductive pins or risers, plated-through holes, or the like. Normally, the internal circuit layers are formed and the external layers are left as solid copper to permit plating, if plating is used as a means for interconnecting the several circuit layers. Many processes are known for laminating and interconnecting the layers of multilayer printed-circuit boards. The particular process utilized to assemble the circuit board of the presently described embodiment is not germane to the present invention and will not be described; however, reference is made to *Printed Circuits Handbook*, edited by C. F. Coombs, Jr., McGraw-Hill, 1967, for a detailed description of multilayer printed-circuit board techniques.

The circuit board 1 of FIGS. 1 and 2 is shown including an interconnecting element 12 comprising a plated-through hole 14 having a wall 16 plated with conductive material such as copper and being disposed along a central axis coincident with the center of an interconnecting pad 18. The pad 18 which forms a part of the circuit layer 5 is registered with and overlies other interconnecting pads 20, 22 which form parts, respectively, of the circuit layers 6, 10. The plated-through hole 14 passes through each of the pads 18, 20, 22 thereby establishing electrical interconnection of the pads via the plated wall 16. The plated wall 16 passes through voids 24, 26 formed, respectively, in the internal circuit layers 7, 8.

In order to simplify the description and explanation of the multilayer printed-circuit board 1, the planar printed-circuit layers 5–10 illustrated in FIG. 2 are each given a reference number corresponding to a figure number of the drawing in the present application. FIGS. 5–10 are illustrations of "artwork masters" of the circuit layers 5–10 of FIG. 2. An artwork master is defined herein as an enlarged layout or drawing of a printed circuit pattern which may be reduced photographically to make a board-size "tool master." The tool master is utilized to reproduce the circuit pattern in conductive metal such as copper on a substrate in accordance with known processes. The pattern depicted by the artwork master may be either unique to a particular type board, or universal or generic to many board types. A "layout master" is defined as an enlarged, precisely predefined layout of a universal printed circuit pattern utilized by a designer of printed-circuit boards to make a unique artwork master. Both layout masters and artwork masters are most precisely generated by apparatus such as X-Y plotters supplied with predetermined or calculated pattern parameters from an external source such as a data processor.

Figure 5:
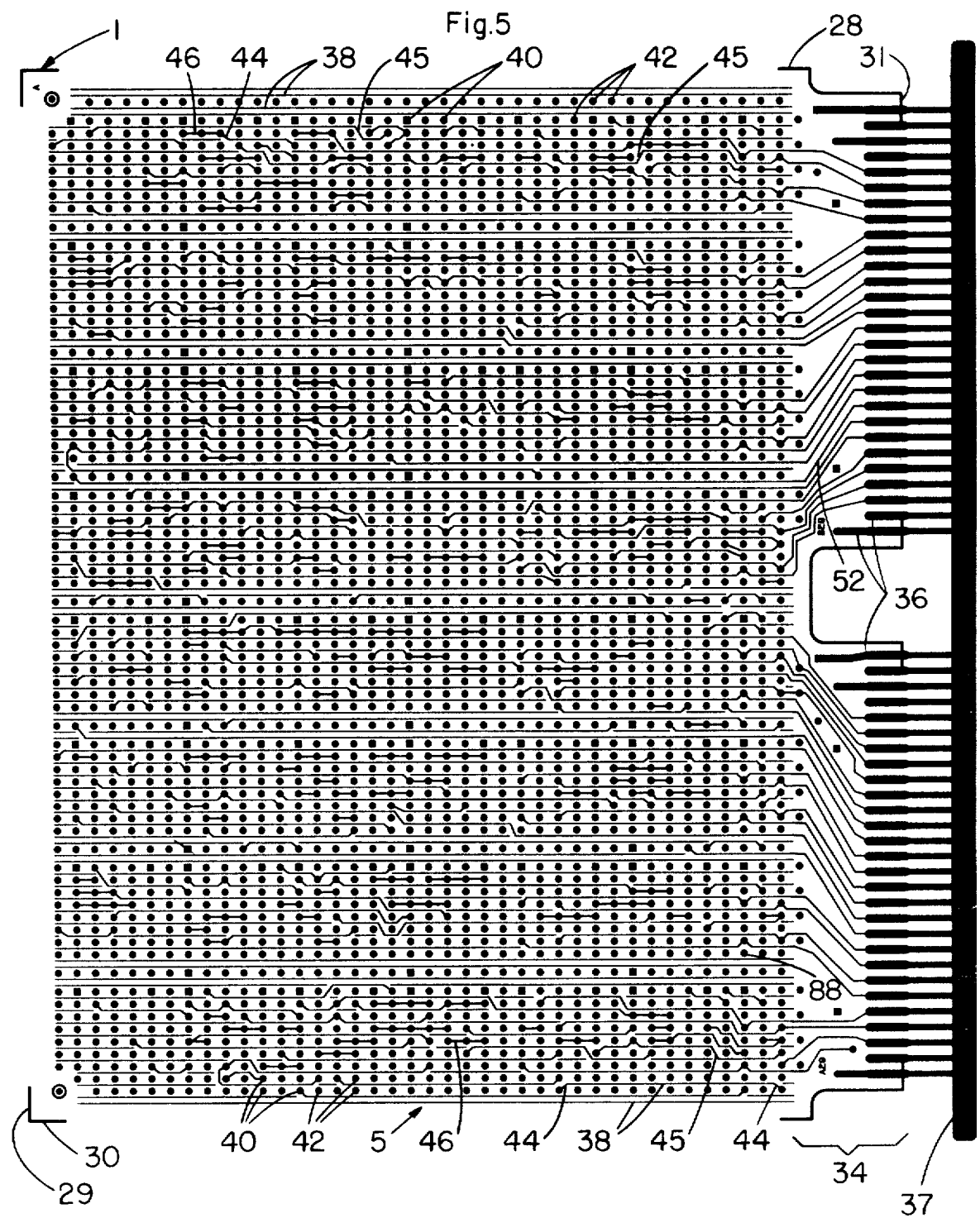
FIGS. 5 through 10 are illustrations of artwork masters of the various printed circuit layers, named below, of one embodiment of the present invention.

Referring now to FIG. 5 in conjunction with FIGS. 1 and 2, a unique artwork master of the external circuit layer 5 is shown. The circuit pattern 5 overspreads a predetermined area bounded by edges 28–31 of the circuit board 1. The circuit pattern 5 includes elements located in an input/output area (subtended by reference numeral 34) of the board 1 disposed along and adjacent the edge 31. The input/output area 34 includes a plurality of conductive terminals 36 disposed along the edge 31 for transferring signals and power between the board 1 and an electrical connector (not shown) which receives the edge 31 of the board 1. A conductive strip 37 is provided for plating operations; it is severed from the terminals 36 along the edge 31 after the plating operations are completed. The outer circuit pattern 5 includes a plurality of mutually parallel traces such as the traces 38 of FIGS. 1, 2 and 5, which are evenly distributed over the board and extend substantially across the entire board from the input/output area 34 to the edge 29. An array of interconnecting pads such as component pads 40 and signal pads 42 are also evenly distributed over the board forming mutually parallel rows of pads interspersed between the traces 38, as well as mutually parallel columns of pads extending across the board transversely of the traces 38. A plurality of minor or short length traces such as the minor traces 44–46 interconnect the parallel traces 38 and the pads 40,42. For example, a first type of the minor traces 44 connects predetermined points of the traces 38 with adjacent pads; a second type of the minor traces 45 interconnects predetermined points of the traces 38 with other points of adjacent traces; and a third type of the minor traces 46 interconnects adjacent pads. Referring momentarily to FIGS. 1 and 2, the minor trace 44 connects the parallel trace 38' with the signal pad 18. The parallel trace 38' is longitudinally broken or interrupted in an area 48 adjacent a preselected point of connection 50 between the trace 38' and the pad 18. Returning to FIG. 5, the input/output area 34 includes a plurality of I/O traces such as the trace 52 interconnecting selected ones of the conductive terminals 36 with the parallel traces 38. The circuit layer 5 thus serves as a means for selectively transferring signals across the board 1 in a direction generally parallel to the traces 38. The minor traces 44–46 (including the attendant interruptions of the parallel traces 38) and the I/O traces 52 are the only portions of the circuit pattern 5 which are unique to a particular type of board.

Figure 10:
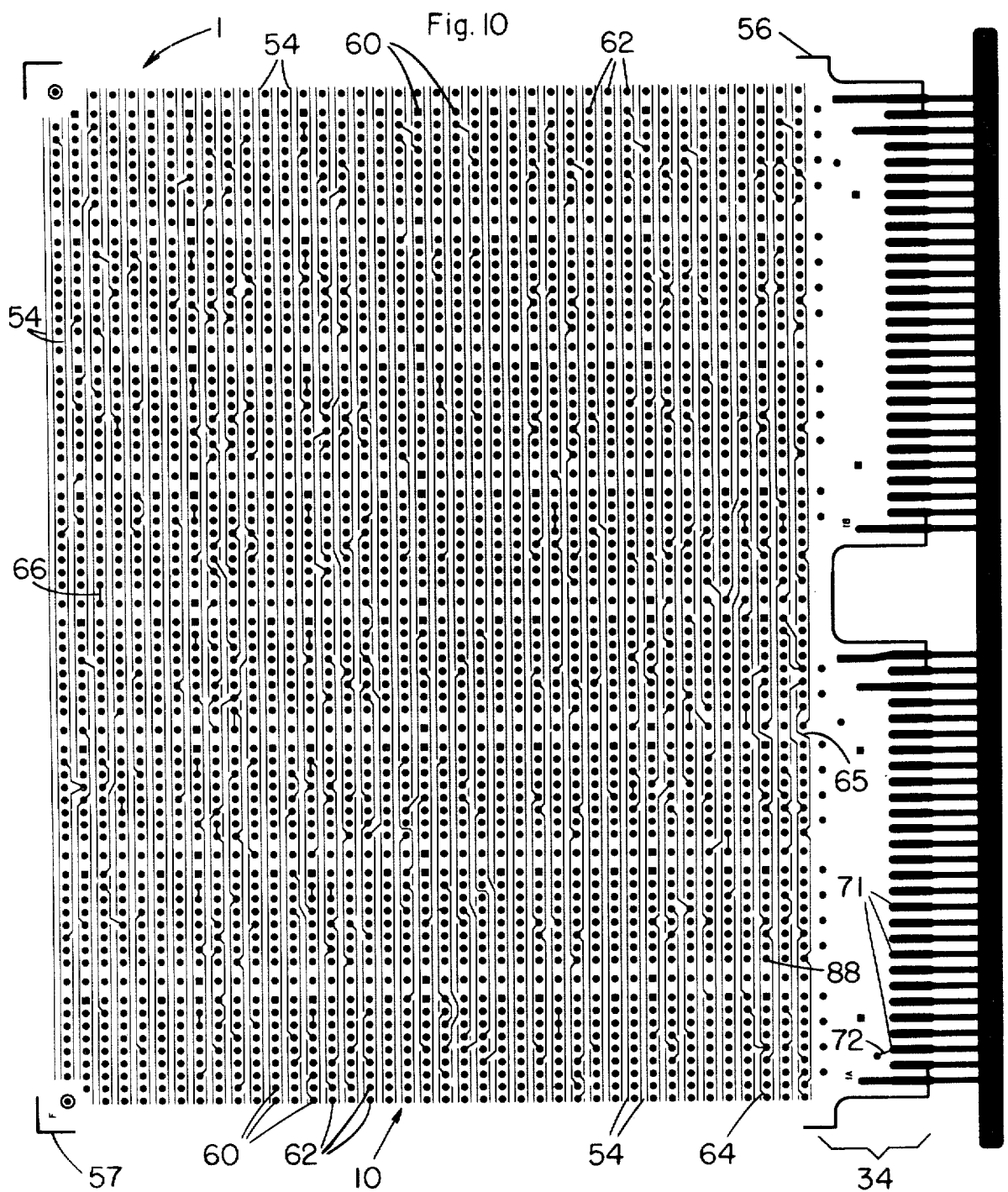

Referring now to FIG. 10, a unique artwork master of the external circuit layer 10 shows a circuit pattern overspreading the board and including a plurality of mutually parallel circuit runs 54 evenly distributed over the board and extending virtually across the entire board from edge 56 to edge 57 in a direction which is transverse the direction of the traces 38 of FIG. 5. An array of interconnecting pads such as component pads 60 and signal pads 62 are also evenly distributed over the board forming mutually parallel columns of pads 60, 62 interspersed between the parallel runs 54, as well as mutually parallel rows of pads extending across the board transversely to the runs 54. The array of pads 60, 62 of the circuit pattern 10 corresponds dimensionally and is registered with the array of pads 40, 42 of the circuit pattern 5 when the board 1 is assembled. A plurality of minor or short length interconnecting runs such as the runs 64–66 function similarly to the minor traces 44–46 of FIG. 5. Referring momentarily to FIGS. 1 and 2, the parallel run 54' is connected from a preselected point 68 thereon to the signal pad 62 via the minor run 64. The parallel run 54' is longitudinally broken or interrupted in an area 70 adjacent the point of connection 68.

Returning to FIG. 10 the circuit layer 10 includes edge terminals 71 and input/output runs such as the run 72 in the input/output area 34 of the board 1. The minor runs 64–66 (including the attendant interruptions of the parallel runs 54 are the only portions of the circuit pattern 10 which are unique to a particular type of board. Viewing FIGS. 5 and 10 together, it is evident that a signal may conveniently be routed between any selected point on the board and any other point thereon including the edge terminals 36, 71 by a plurality of different routes utilizing the transversely extending traces 38 and runs 54.

Figure 6:
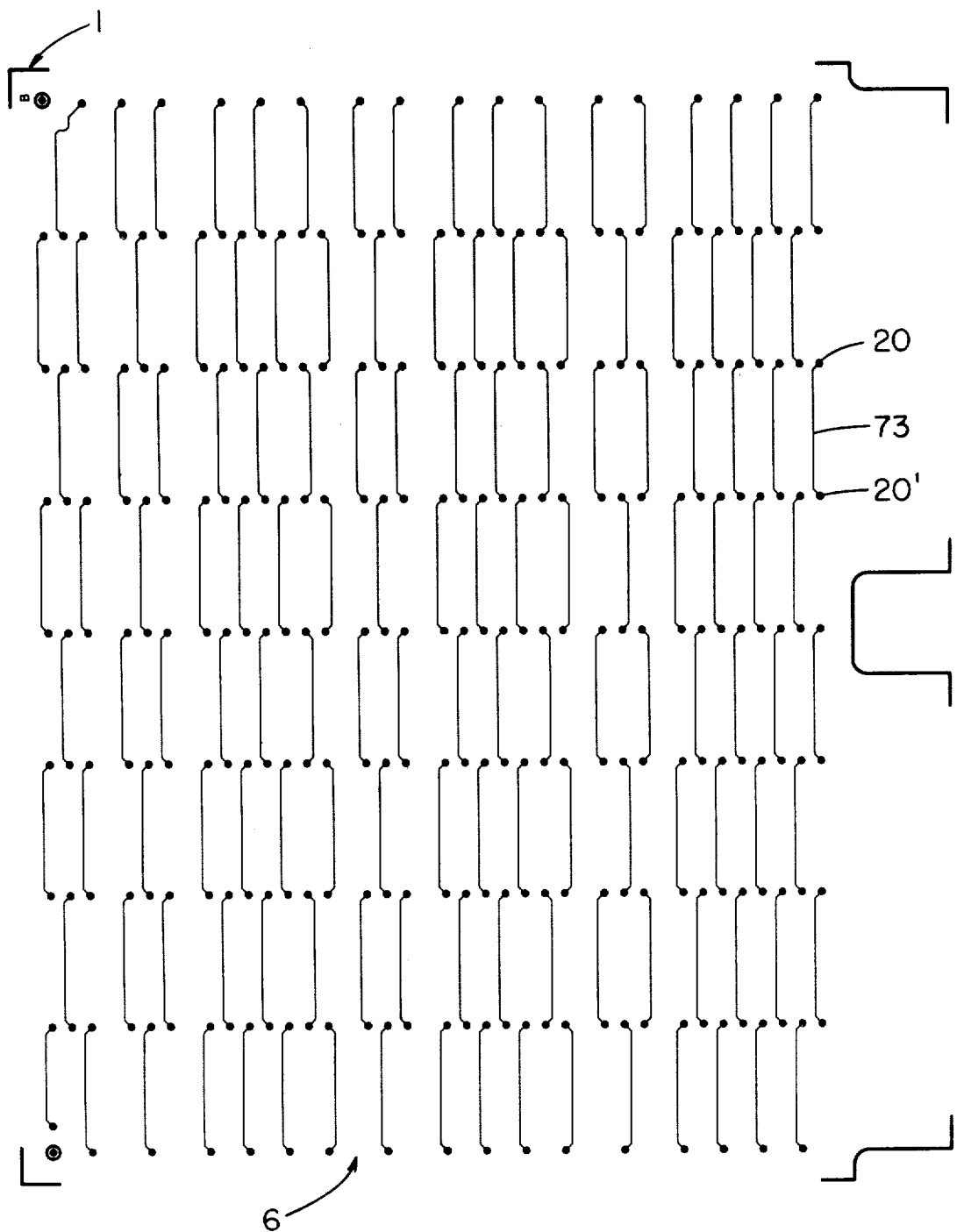
Figure 14:
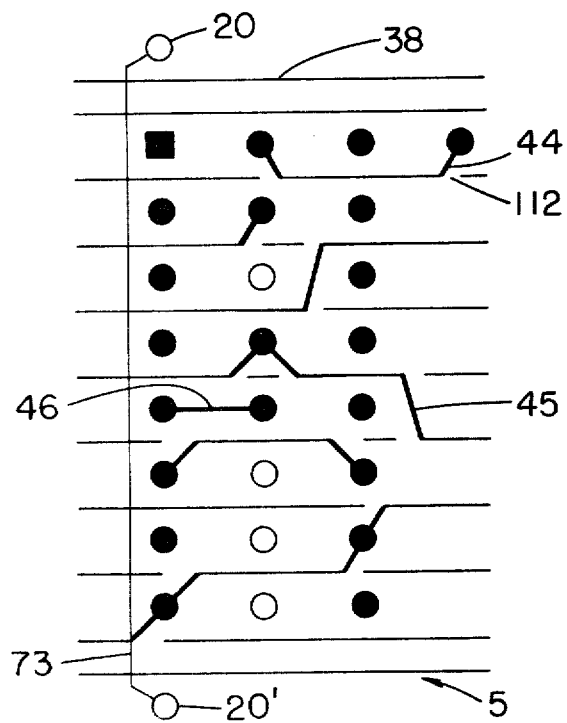

Referring now to FIG. 6 in conjunction with FIGS. 1 and 2, the internal circuit pattern 6 is a universal pattern common to all board types and comprises a plurality of equal-length crossunder runs such as the run 73 each interconnecting a pair of crossunder signal pads 20, 20'. FIGS. 1 and 2 show a portion of a typical crossunder run 73 connected to the signal pad 20. Referring momentarily to FIG. 14, another view of a typical crossunder run 73 is shown in relation to the circuit layer 5. The runs 73 are oriented transversely to the parallel traces 33 of the outer layer 5 and are separated therefrom by the layer 5' of insulation of a predetermined thickness. The crossunder runs 73 are distributed over the area of the circuit layer 6 in accordance with predetermined universal circuit parameters; the determination of the length and distribution of the crossunder runs 72 is discussed in a subsequent part of this specification.

Figure 9:
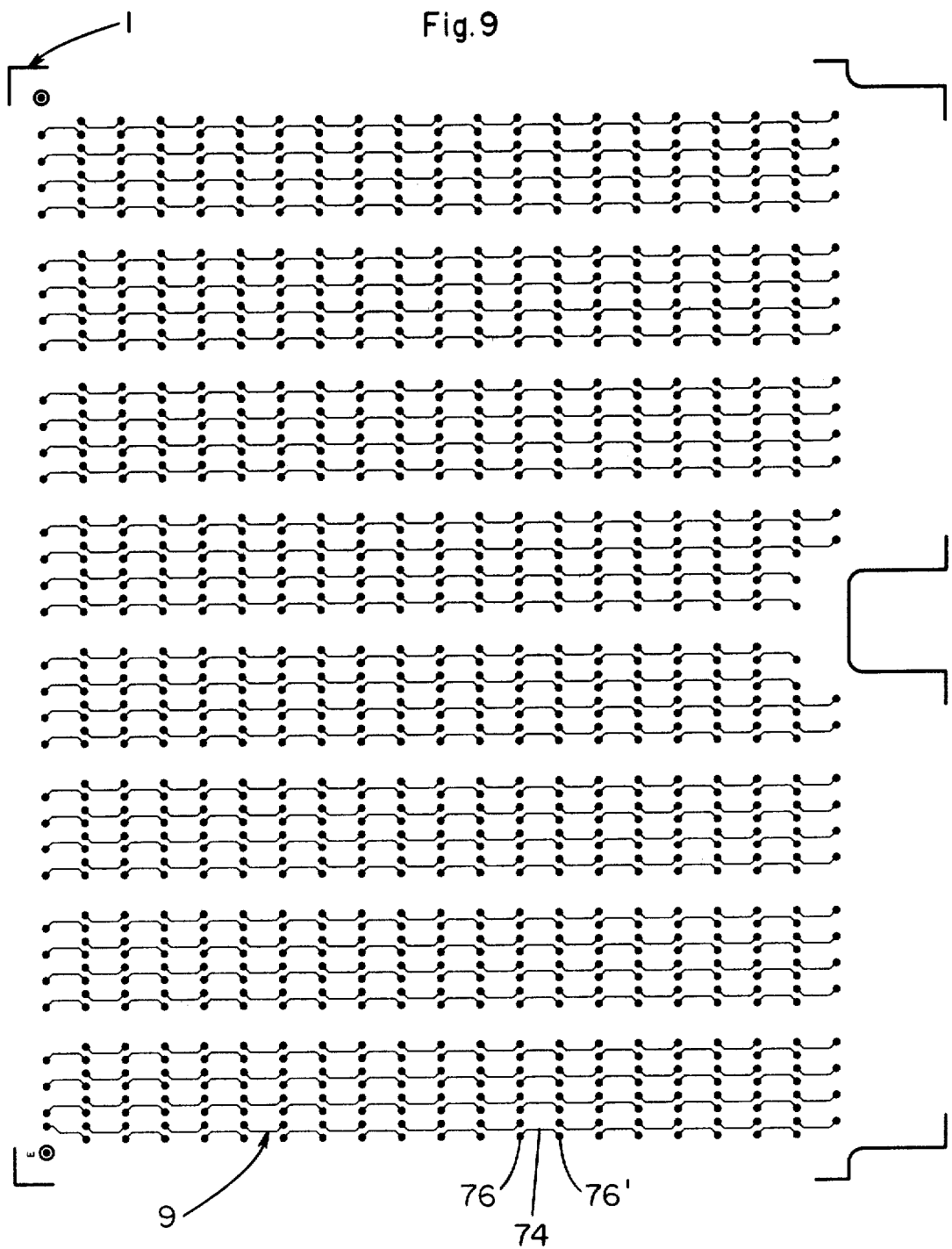
Figure 15:
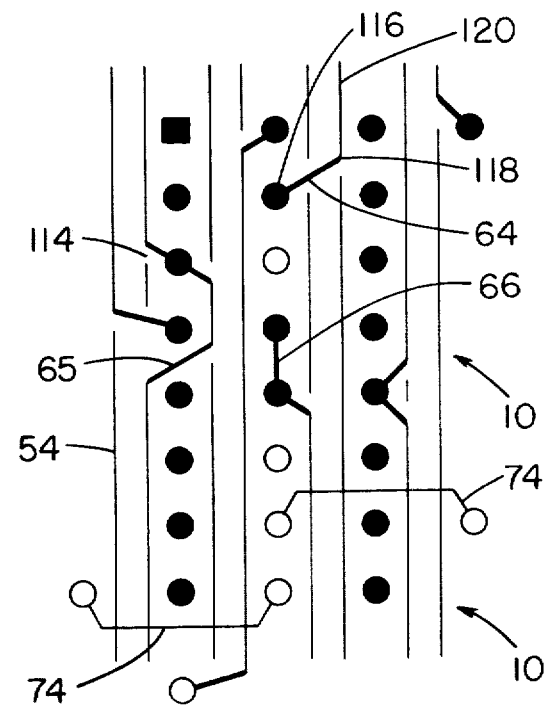

Referring to FIG. 9 in conjunction with FIGS. 1 and 2, the universal internal circuit pattern 9 comprises a plurality of crossover runs such as the run 74 each interconnecting a pair of crossover signal pads 76, 76'. The runs 74 are oriented transversely to the parallel runs 54 of the circuit layer 10 and are separated therefrom by the layer 9' of insulation of predetermined thickness. The crossover runs 74 are distributed over the area of the circuit layer 9 in accordance with the predetermined universal circuit parameters. Referring momentarily to FIG. 15, a pair of typical crossover runs 74 is shown superposed in relation to the parallel runs 54 of the circuit layer 10. FIGS. 1 and 2 show the crossover run 74 connected to the signal pad 76.

Both the crossunder runs 73 and crossover runs 74 are provided to augment the signal routing capability provided by the outer circuit layers 5, 10, and need not be used unless required for particularly dense circuit interconnect patterns.

Figure 7:
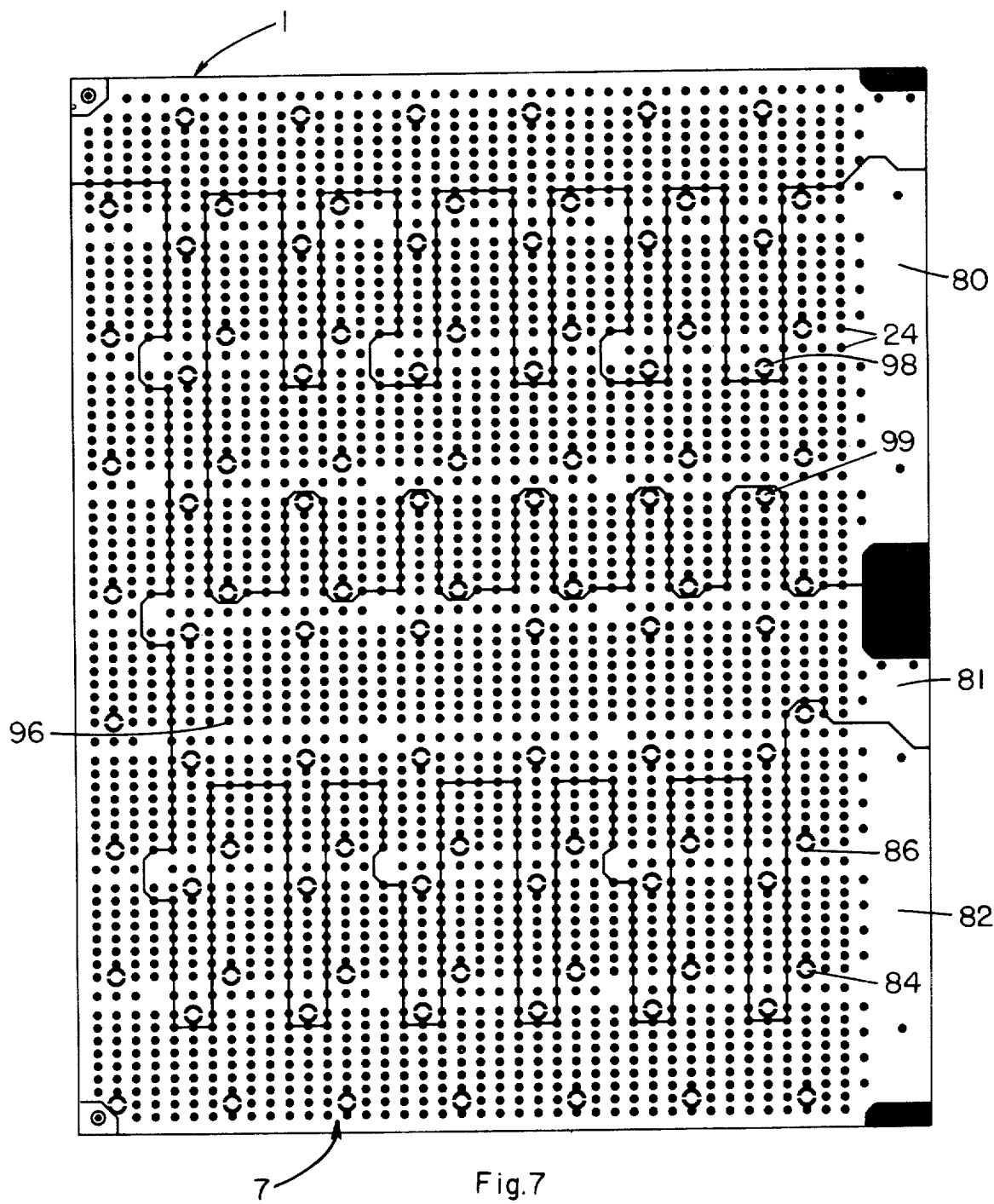

FIG. 7 depicts an artwork master of a voltage plane corresponding to the internal circuit layer 7 of FIG. 2. The voltage plane pattern of FIG. 7 is shown photographically negative, having areas 80-82 of conductive material such as copper covering substantially the entire surface of the layer 7. A plurality of voids such as the voids 24 correspond generally with and are aligned with virtually all of the conductive pads 40, 42; 20; 76; and 60, 62, respectively, of the other circuit layers 5; 6; 9; and 10. The voids 24 are provided to allow passage of the interlayer conductors 12 (see FIG. 2) therethrough. Each of the conductive areas 80-82 of FIG. 7 includes a plurality of voltage bus interconnect areas such as the area 84. Each of the areas 84 is partially surrounded by a pair of thermal isolation voids 86. The locations of the bus interconnect areas 84 are preselected to align with corresponding component pads such as the pad 88 of the circuit layers 5, 10 (FIGS. 5 and 10).

Figure 8:
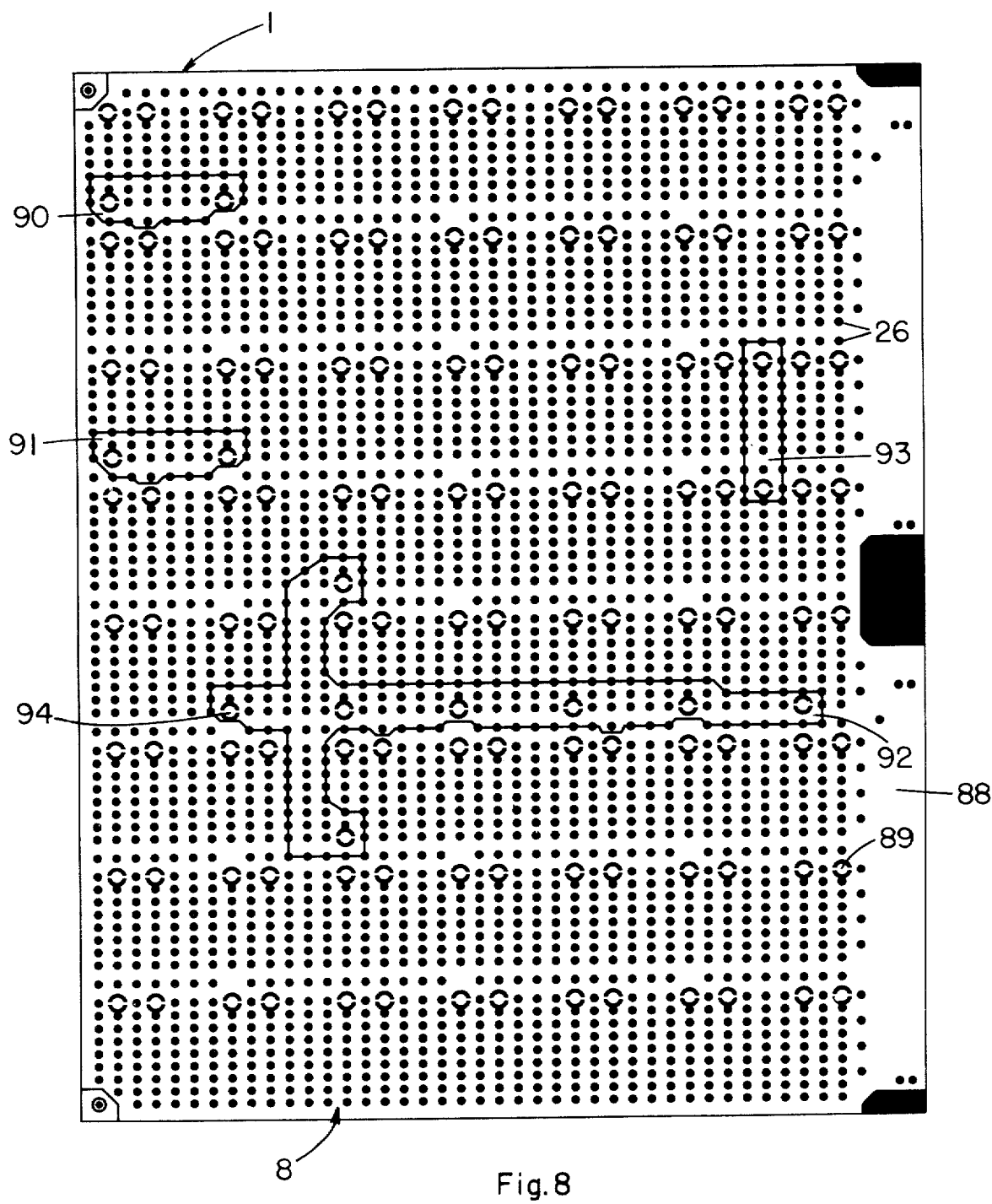

FIG. 8 depicts an artwork master of a ground plane corresponding with the circuit layer 8 of FIG. 2. The ground plane pattern of FIG. 8 is shown photographically negative, having an area of conductive material 88 such as copper covering substantially the entire surface of the board. A matrix of voids such as the voids 26 are provided for passage of the interlayer conductors 12 therethrough (see FIG. 2). A plurality of ground-plane interconnect areas such as the interconnect area 89 of FIG. 8 are provided for establishing ground connections to the board components. The interconnect areas 89 are similar in form to the interconnect areas 84 of the power-plane circuit pattern 7. The circuit layer 8 of the presently described embodiment, FIG. 8, also includes voltage straps 90-93 to aid in the even distribution of the voltages throughout the board without degrading the even distribution of the ground 88. Viewing FIGS. 7 and 8 together, the straps 90-92 are provided for allowing selective interconnection of the voltage buses 80, 82 of the voltage plane 7. The strap 92 provides further for the extension of either of the voltage buses 80 or 82 to the area of the strap 92 for distribution via the centrally disposed interconnect areas thereof, such as the interconnect area 94. The centrally disposed interconnect areas 94 are in registration with voids such as the void 96 of the voltage bus 81. The strap 93 provides for even distribution of the voltage of bus 81 by shorting the interconnect areas 98, 99 thereof.

Figure 3:
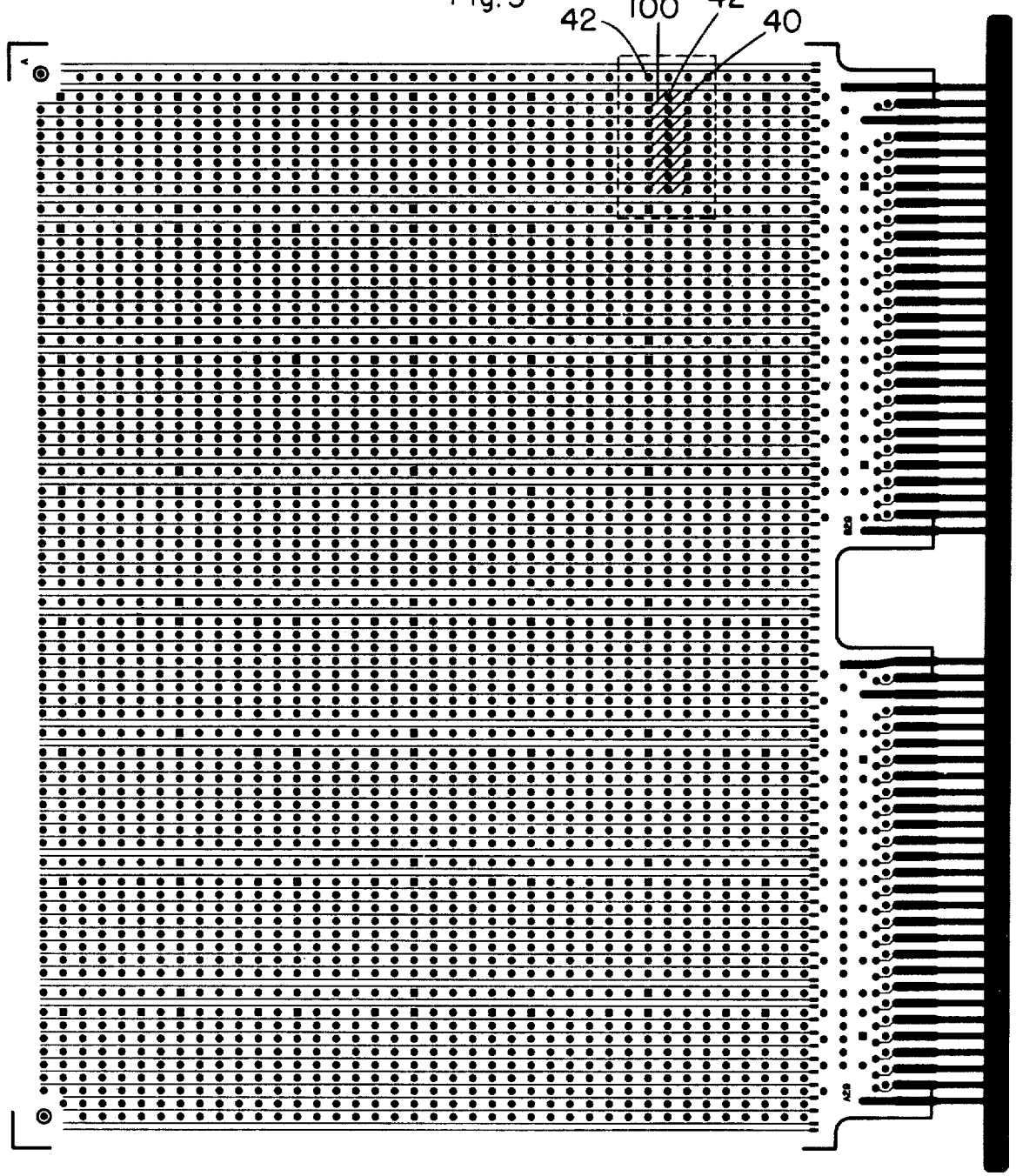
FIGS. 3 and 4 are illustrations of layout masters of printed circuit layers in accordance with the process of the present invention.
Figure 4:
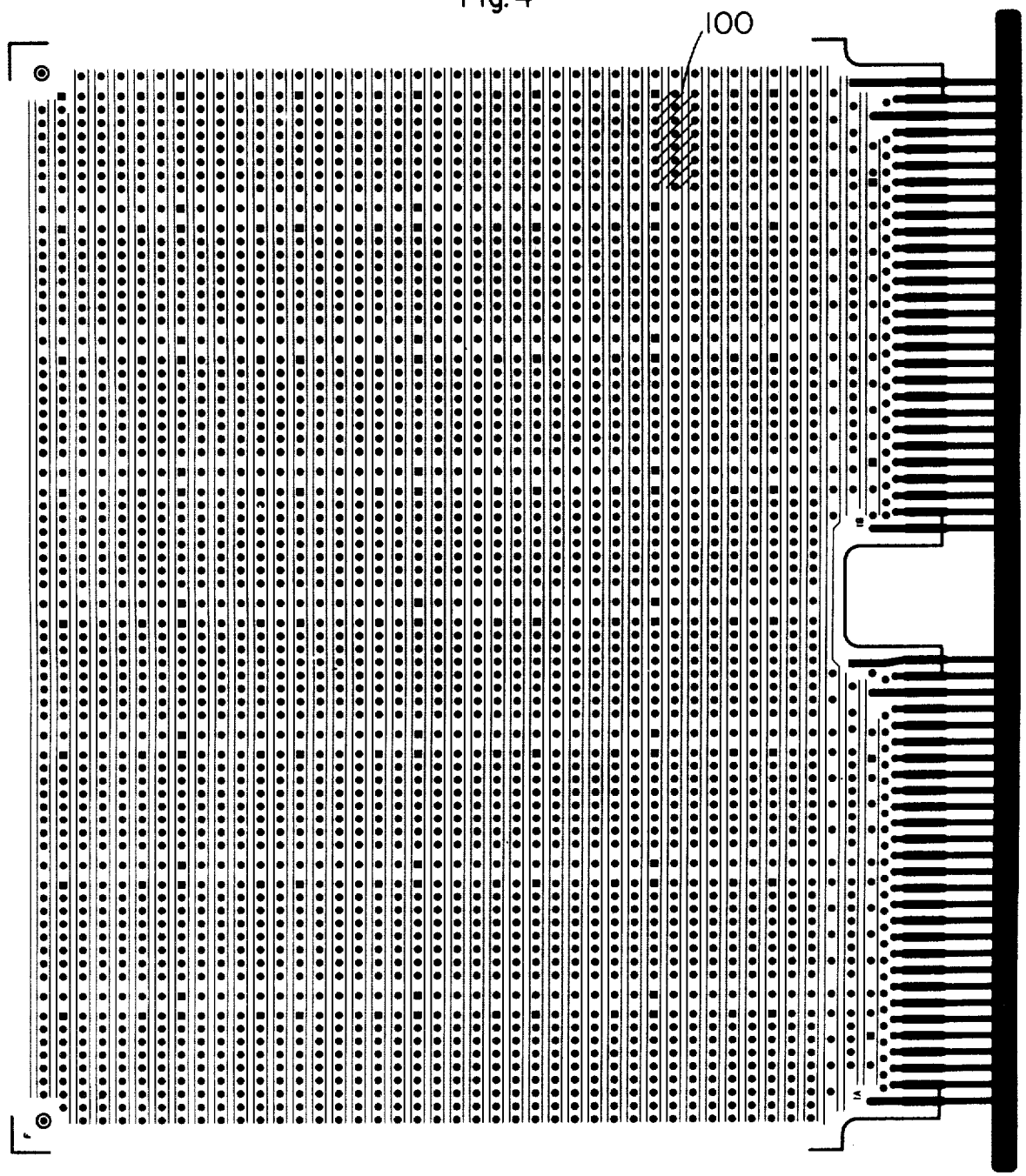
Figure 11:
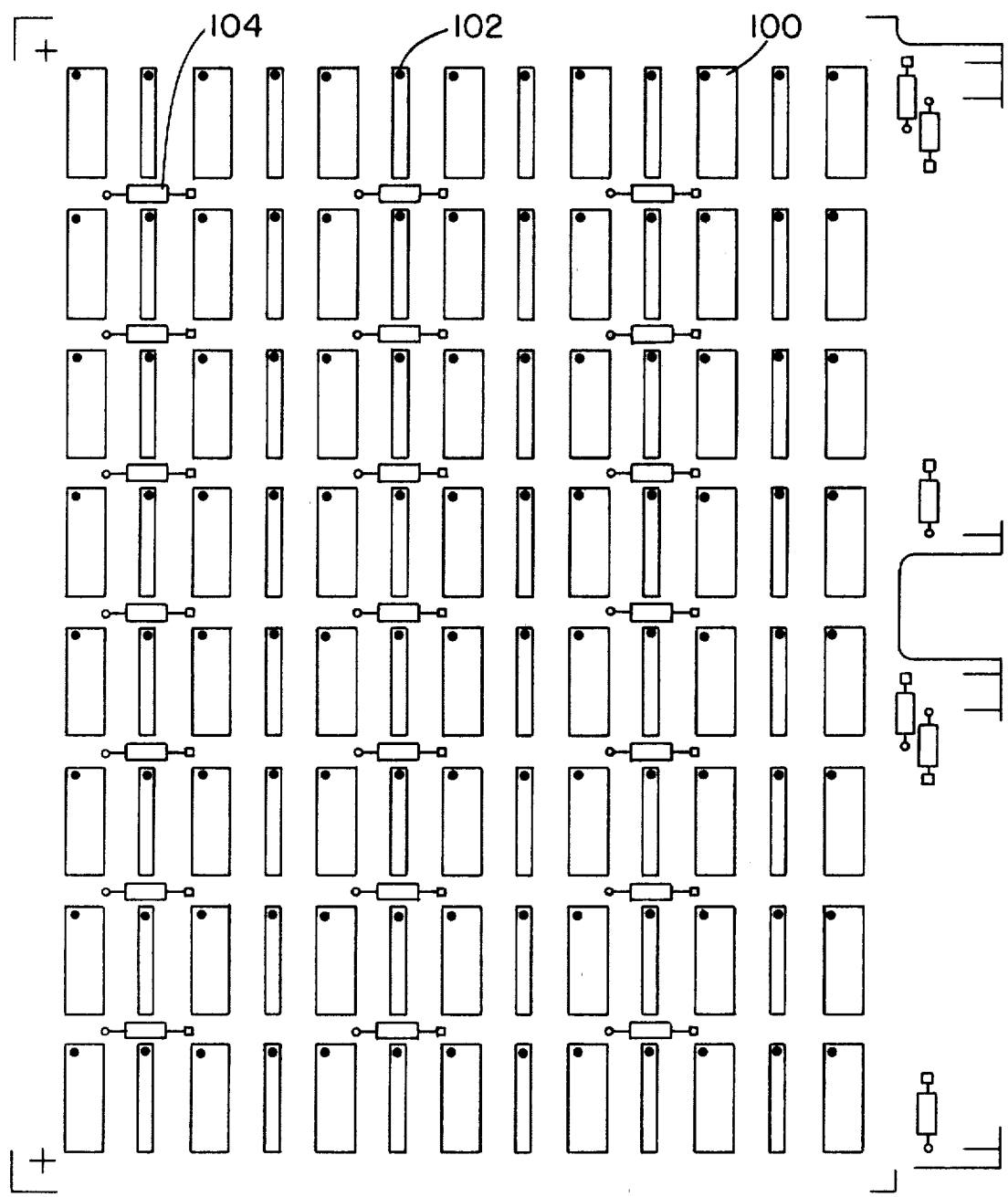
FIG. 11 is an illustration of a layout master of a component matrix in accordance with the process of the present invention.

Recall now, that each of the outermost signal layers 5 and 10 includes both component pads 40, 60 and signal pads 42, 62. The distinction is drawn by viewing FIG. 11 in conjunction with FIGS. 3 and 4. FIG. 11 depicts a layout master of a component matrix which includes representations or outlines of components such as a sixteen-pin dual-in-line package (DIP) 100, an eight-pin single-in-line package (SIP) 102, and a discrete component 104. FIGS. 3 and 4 depict layout masters from which artwork masters of unique circuit layers such as, respectively, the layers 5 and 10 may be generated utilizing the process of the present invention. The cross-hatched areas 100 of FIGS. 3 and 4 represent the area bounded by the outline 100 of FIG. 11 when the three layout masters are superposed and aligned. It is evident from FIG. 3 that the sixteen outboard pads 40 to which the DIP pins connect are component pads, and the other pads 42 (including the central pads of the cross-hatched area) within the area defined by dashed lines are signal pads.

The universal layout masters of FIGS. 3, 4, 6, 9 for the presently described embodiment of a multilayer board were generated in accordance with parameters determined both by mathematical design and by empirical testing of actual circuits. The characteristic impedance of typical circuit runs; and signal propagation delay, crossover capacitance and crosstalk between circuit runs was calculated and measured in a test board having circuits of various length, thickness, width, population and mutual proximity, and with various dielectric thickness. The tests and calculations yielded the following universal parameters for ECL 10K logic:

1. Internal circuits 6, 9 are oriented transversely to the adjacent external circuits 5, 10.

2. Internal circuits 6, 9 are separated from external circuits 5, 10 by 2.5 mils (63.5 micrometers) of epoxy-glass dielectric ($e_r \approx 4.5$).

3. Internal circuits 6, 9 are separated from the adjacent central circuits 7, 8 by 25 mils (0.635 mm) of epoxy-glass dielectric.

4. Circuit runs are 10 mils (0.254 mm) wide.

5. Spaces between circuit elements are at least 40 mils (1.016 mm) wide.

6. No more than twenty circuit runs should cross a circuit run of an adjacent layer.

7. The maximum length of crossover or crossunder runs is 1 inch or 2.54 cm. The crossover and crossunder runs may, in some instances, form stubs, e.g., when only one of the pads interconnected thereby is drilled and plated.

The universal layout masters represented by FIGS. 3, 4, 6, and 9 were digitized and plotted within the bounds of the above-mentioned parameters for maximum precision in accordance with known techniques. The application of the universal circuits, predesigned and tested as an assembled entity, to a plurality of uses without the need to adhere to either calculated or empirical design criteria frees the board designer of the complex tasks usually associated with the generation of a unique multilayer board. The viability of the process of the present invention lies in part in the standard lead configurations of modules such as DIP's which allows the formation of a predetermined matrix of component and signal pads and a regular grid of conductive runs for routing signals across the board, all predesigned and plotted to the highest degree of accuracy attainable at the present state of the art.

Figure 12:
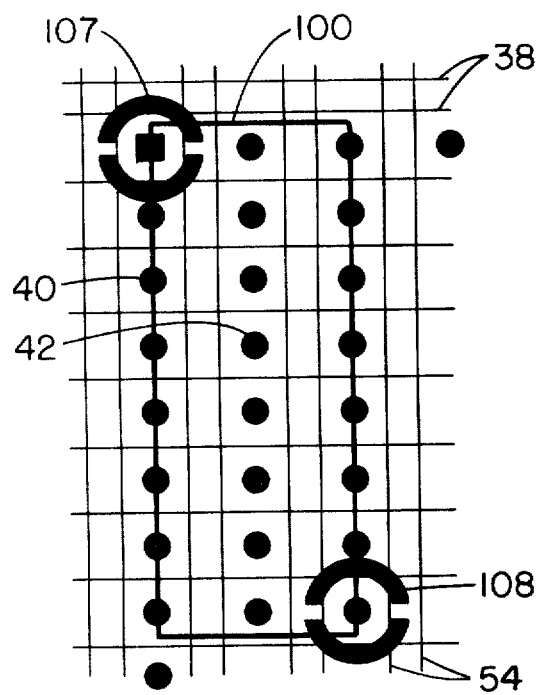
FIGS. 12 through 15 illustrate the process of generating artwork masters in accordance with the present invention.

Referring now to FIGS. 12-15, the process of generating artwork masters in accordance with the present invention is explained. FIG. 12 represents a portion of the full scale (e.g., 4×) layout masters of FIGS. 3, 4 and 11 superposed to reveal a grid formed by the traces 38 and runs 54. The module outline 100 bisects the component pads 40, leaving the signal pads 42 clear. The voltage and ground interconnect areas represented, respectively, by the thermal isolation voids 107, 108 are shown for reference. Layout masters for the power and ground planes need not be utilized for generating the outer-layer artwork masters. FIG. 12 represents a portion of the scene viewed by the designer of a unique circuit board prior to establishing the plurality of short length runs and traces which render a particular type of board unique. It is noted that the layout masters for the circuit layers 6 and 7 are not shown in FIG. 12. The embodiment of the invention described with reference to FIGS. 5 and 10 was assembled without using the crossunder runs 73 or crossover runs 74; however, an example of their use is described in the ensuing discussion.

Figure 13:
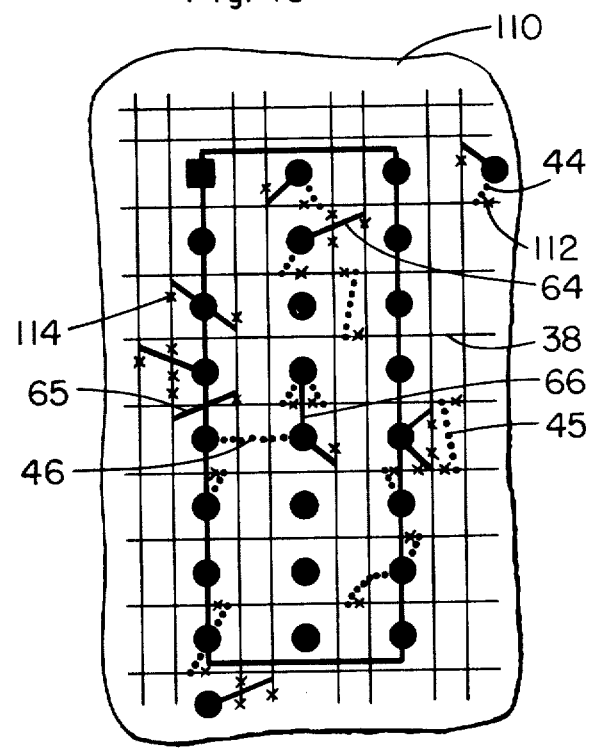

FIG. 13 depicts generally the composite of superposed layout masters of FIG. 12 with an additional transparent overlay 110 such as vellum or mylar. In choosing conductor routes, the designer marks the overlay 110 with representations of the minor traces 44-46 (shown as dotted lines) associated with the circuit layer 5, and with representations of the minor runs 64-66 (shown as solid lines) associated with the circuit layer 10. Interruptions of the circuit traces 38 and circuit runs 54 are represented in FIG. 13, respectively, by small x's 112 and 114. The representations 44-46, 112 marked on the transparent overlay 110 are then utilized as an underlay to alter the layout master of FIG. 3 to form a unique artwork master 5 (see also FIG. 5). This step is illustrated by comparing the like reference numbers of FIGS. 13 and 14. It is noted that the illustrative crossunder run 73 shown in FIG. 14 does not form a part of the artwork master 5.

In generating artwork masters for unique circuit boards in accordance with the present invention there is no formal artwork layout as it is currently known. The transparent overlay 110 if viewed independently of the layout masters would appear as a muddle of unrelated marks randomly placed on the overlay. When the transparent overlay 110 is completed, it is aligned separately under each of the layout masters and the layout master is then altered in accordance with any of the techniques well known in the art. The alterations required to generate a unique artwork master of a circuit pattern such as the circuit pattern 5 are minor in nature when compared with the design effort required to generate full artwork. The alterations involve only relatively short-length interconnections between adjacent circuit elements, which elements are previously designed and precisely dimensioned utilizing a first degree of layout precision which generally is the highest precision attainable in the multilayer circuit board art. The alterations are effected utilizing a technique having a second degree of layout precision which is less than the first degree. "Degree of precision" is a relative term. For the purposes of this disclosure the maximum range between the first and second degrees of precision is defined as that between the precision obtainable with an automatic X-Y plotter, and that obtainable by taped or inked artwork.

Comparing now FIGS. 13 and 15, the representations 64-66, 114 marked on the transparent overlay 110 are utilized as an underlay to alter the layout master of FIG. 4 to form a unique artwork master 10 (see also FIG. 10). The word "adjacent" used in the context of the short interconnecting runs 44-46; 64-66 described with reference to FIGS. 5, 10, 14 and 15 means "reasonably close," e.g., the run 64 of FIG. 15 connects the signal pad 116 to a point 118 on the circuit run 120, which point is two runs removed from the pad 116. It would not be unreasonable to assume that a short run could interconnect points three elements removed from each other; however, the majority of the short runs are between contiguous traces or pads and only occasionally between elements not contiguous. It is noted that the crossover runs 74 shown in FIG. 15 do not form a part of the artwork master 10.

The unique artwork masters 5 and 10 may be generated by known methods such as the so-called "cut and tape" process. This technique alters the predefined precision artwork by removing selected portions of the traces as by scraping or otherwise removing the photographic emulsion and adding short lengths of photographically opaque substance such as ink or tape to form the required unique interconnects. A quicker, less precise, and consequently less costly method is thus utilized to generate the unique artwork for a multilayer circuit board, while retaining the precision, high terminal density, and uniform electrical impedance and coupling of much more expensive boards. This is made possible by the predefinition of layout masters utilizing a high degree of precision commensurate with presently available automatic plotting apparatus.

Photoreduction of the completed artwork masters is accomplished using the ground or voltage plane 1:1 artwork masters for dimensional control, assuring that all of the planes form a matched set of board artwork with minimum dimensional deviations among the various planes.

When the unique circuit routes have been established, a drilling program may be prepared for establishing unique locations of the board interconnects. Viewing FIGS. 14 and 15, for example, plated-through holes are established at the pad locations which are shown as solid; no interconnection is established at the pad locations shown as open circles. A drilling template may be prepared for a unique circuit board design. The required number of presassembled universal boards may then be drilled and the interconnects plated at the same time the outer circuit layers 5, 10 are plated. After the drilling and plating operations, the components may be installed on the board. Alternatively, a master drill tape or template drilling all pads of the matrix may be utilized. Further and substantial cost reduction is achieved in the latter described embodiment by eliminating the unique hole pattern. The unique interconnections of the outermost layers provide the desired interconnect pattern by selecting desired ones of the pads for inclusion in the overall pattern of circuits, leaving unneeded pads disconnected.

I have described herein a method of making multilayer circuit boards by predesigning the universal internal circuit patterns and the universal exterior circuit patterns with established circuit characteristics which will not be degraded by subsequent, randomly generated alterations of the exterior circuit patterns effected to establish a final board configuration. Instead of designing six separate circuit patterns for each unique board as in the prior art it is necessary only to provide minor alterations of the two predesigned exterior circuit patterns. The method has yielded significant savings of cost and time over previous methods, while maintaining accuracy. The first design of a unique production printed circuit board in accordance with the invention was accomplished in a total time of two weeks and two days, including time for an assembly drawings, marked-up schematic for gate and component pin placement, three different check steps, and photoreduction. All pads were drilled from the universal drill tape. This first effort compared favorably with established prior art techniques which, at best, required four weeks for a less complex design.

The method of making multilayer circuit boards in accordance with the present invention was found to be superior to prior art techniques utilizing predefined interior circuit runs because of the assembly design parameters considered in the present method. The synergistic results achieved by the present invention are made evident, for example, by viewing FIGS. 5 and 10 and observing the uniform distribution of etched copper on the outer layers of a completed design.

While the principles of my invention have now been made clear in the foregoing description, it will be immediately obvious to those skilled in the art that many modifications of structure, arrangement, proportions, the elements, material and components may be used in the practice of the invention which are particularly adapted for specific environments without departing from those principles. The appended claims are intended to cover and embrace any such modifications within the limits only of the true spirit and scope of my invention.

What is claimed is:

1. In an artwork master for the manufacture of one layer in a multilayer printed circuit board:
    a plurality of parallel artwork traces corresponding to conductive traces on the one layer in the printed circuit board, said traces extending substantially across the artwork master;
    an array of artwork pads corresponding to conductive pads on the one layer of the printed circuit board, said artwork pads distributed over the artwork master and forming parallel columns interspersed between said parallel artwork traces; and
    interconnecting artwork traces extending from at least some of said parallel artwork traces to adjacent ones of said artwork pads, said parallel artwork traces including interrupted portions adjacent at least some of said interconnecting artwork traces;
    said parallel artwork traces and said artwork pads being formed with a higher degree of precision than said interconnecting artwork traces and said interrupted portions of said parallel artwork traces.

2. The artwork master of claim 1, further comprising artworks terminals on the artwork master corresponding to conductive terminals along one edge of the one layer of the printed circuit board.

* * * * *